United States Patent [19]
Jinbo

[11] Patent Number: 6,064,089
[45] Date of Patent: May 16, 2000

[54] SEMICONDUCTOR DEVICE

[75] Inventor: Toshikatsu Jinbo, Tokyo, Japan

[73] Assignee: NEC Corporation, Tokyo, Japan

[21] Appl. No.: 08/900,823

[22] Filed: Jul. 25, 1997

[30] Foreign Application Priority Data

Aug. 9, 1996 [JP] Japan ..................................... 8-210762

[51] Int. Cl.$^7$ .................................................. H01L 29/72
[52] U.S. Cl. ......................... 257/346; 257/394; 257/401; 257/666; 257/692; 257/773; 257/786
[58] Field of Search ..................................... 257/346, 394, 257/401, 666, 692, 773, 786

[56] References Cited

U.S. PATENT DOCUMENTS 5,773,867  6/1998  Chittipeddi et al. ..................... 257/394

FOREIGN PATENT DOCUMENTS

| | | |
|---|---|---|
| 3-16153 | 1/1991 | Japan . |
| 4-12563 | 1/1992 | Japan . |
| 4259255 | 9/1992 | Japan . |
| 4315454 | 11/1992 | Japan . |
| 5-90537 | 4/1993 | Japan . |
| 5-343419 | 12/1993 | Japan . |
| 7307465 | 11/1995 | Japan . |

*Primary Examiner*—Edward Wojciechowicz
*Attorney, Agent, or Firm*—Sughrue, Mion, Zinn, Macpeak & Seas, PLLC

[57] ABSTRACT

A semiconductor device comprising a substrate having thereon an active area including a plurality of MOS transistors, an inactive area, and adjacent gate wires having walls and a sidewall on the walls of the gate wires. The adjacent gate wires are arranged on the active area and on the inactive area. A first interval between the adjacent gate wires on the active area is greater than a second interval between the adjacent gate wires on the inactive area. The active area includes one of a source and drain region formed by introducing an impurity in an interval between the adjacent gate wires. This structure circumvents the problem which would otherwise occur when the active area between the adjacent gate wires is covered by the sidewalls to thereby block ion implantation. Also, the overall size of the semiconductor device can be reduced and the wiring density can be increased. The gate wiring interval in the portion in which a transistor is formed is a minimum interval needed to provide an opening that is not blocked by the sidewalls. At the same time, the minimum interval realizable by patterning technology is applied to the interval between the gate wires when used as signal wires on the inactive area.

26 Claims, 12 Drawing Sheets

6,064,089

SEMICONDUCTOR DEVICE

BACKGROUND OF THE INVENTION

1. Field of the Invention

The present invention relates to a semiconductor device and method of manufacturing the same and, more particularly, to a device comprising MOS transistors and adjacent gate wires having sidewalls arranged on the walls of said gate wires.

2. Description of the Related Art

MOS transistors having gate wires having sidewalls include an LDD (Lightly Doped Drain) transistor, a DDD (Double Diffused Drain) transistor, and a sidewall transistor.

The following specifically describes methods of manufacturing these MOS transistors.

First, a general process for manufacturing a N-type LDD transistor is described by way of example with reference to FIGS. 5(a)–5(e). FIGS. 5(a)–5(e) show a main sectional view illustrating a general process of manufacturing an N-type LDD transistor.

First, as shown in FIG. 5(a), a field insulation film 502 and a gate insulation film 504 are formed on a P-type semiconductor substrate 501, on which a polycrystalline silicon film 503 having a thickness of 0.4 μm, for example, is grown to provide a gate wiring. Furthermore, a resist 505 is formed on the resultant substrate into a desired pattern by lithography.

Next, as shown in FIG. 5(b), using the resist 505 as a mask, the polycrystalline silicon 503 is etched into a desired shape, after which the resist 505 is removed. Furthermore, shallow N-diffusion layer areas 506 providing source and drain diffusion areas of the N-type LDD transistor are formed, for example, by ion-implanting phosphorous.

The polycrystalline silicon 503 and the gate insulation film 504 function as a gate electrode of a MOS transistor, while the polycrystalline silicon 503 on the field insulation film 502 functions as a signal wire of the MOS transistor.

Next, as shown in FIG. 5(c), an insulation film 507 composed of an oxide film having a thickness, for example, of 0.2 μm is grown over the whole substrate surface.

Then, as shown in FIG. 5(d), the insulation film 507 grown in the preceding process is etched back by anisotropic etching to leave a sidewall of the insulation film 507 on each of the walls of the polycrystalline silicon 503 which functions as a gate wire.

As shown in FIG. 5(e), arsenic, for example, is ion-implanted to form an N$^+$ diffusion layer area 508 which is deeper than the N$^-$ diffusion layer area 506 to provide the source and drain diffusion layers of the N-type LDD transistor.

The following describes a general process of manufacturing a P-type sidewall transistor as a second example with reference to FIGS. 6(a)–6(e). FIGS. 6(a)–6(e) show a main sectional view illustrating a process of manufacturing the P-type sidewall transistor.

First, as shown in FIG. 6(a), an N-type well area 606 is formed in a P-type semiconductor substrate 601, on which a field insulation film 602 and a gate insulation film 604 are formed. Furthermore, a polycrystalline silicon film 603 having a thickness of 0.4 μm, for example, is grown on the field insulation film 602 and the gate insulation film 604 to provide a gate wire, after which a resist 605 is formed into a desired pattern by lithography.

Next, as shown in FIG. 6(b), with the resist 605 used as a mask, the polycrystalline silicon 603 is etched into a desired shape, after which the resist 605 is removed.

Then, as shown in FIG. 6(c), an insulation film 607 composed of an oxide film having a thickness of 0.2 μm, for example, is grown over the whole substrate surface.

Next, as shown in FIG. 6(d), the insulation film 607 grown in the preceding process is etched back by anisotropic etching to leave a sidewall of the insulation film 607 on each wall of the polycrystalline silicon 603 which functions as a gate wire.

Furthermore, as shown in FIG. 6(e), boron for example is ion-implanted to form P$^+$ diffusion layer areas 608 to provide the source and drain diffusion layers of the P-type sidewall transistor.

After the above-described manufacturing processes, an inter-layer insulation film, a contact hole, and a metal wiring layer are formed in post-processes on the N-type LDD transistor of FIG. 5 and the P-type sidewall transistor of FIG. 6 by means of techniques well known to these of ordinary skill to fabricate the semiconductor devices.

It is apparent that, in addition to the examples of FIGS. 5(a)–5(e) and FIGS. 6(a)–6(e), if phosphorous is not implanted in the process of FIG. 5(b), an N-type sidewall transistor is formed and, if boron is implanted in the process of FIG. 6(b) to form a shallow P$^-$ diffusion layer area, a P-type LDD transistor is formed.

In yet another example, a diffusion layer area is not implanted before sidewall formation. Rather, at least two ion-implant steps are carried out under different conditions after sidewall formation, to thereby obtain a DDD transistor having a source and drain diffusion layer.

The above-described MOS transistors having sidewalls require, in order to actually form the MOS transistors on a semiconductor substrate, a planar mask pattern design for implementing a desired circuit on the semiconductor substrate. Also, an exposure mask for the lithographic process based on the mask pattern design must also be prepared.

The following describes the above-described mask pattern design using, for example, a 2-input NAND CMOS circuit as shown in FIG. 7.

The 2-input NAND circuit has two P-type MOS transistors MP1 and MP2 and two N-type MOS transistors MN1 and MN2, and receives input signals A and B to output data as an output signal OUT.

As an example of a mask pattern for the above-mentioned 2-input NAND circuit, a mask pattern as shown in FIG. 8 may be used. FIG. 8 shows a top view of such a mask pattern.

The 2-input NAND circuit as shown in FIG. 8 has a P-type diffusion layer area 801 and an N-type diffusion layer area 802. A gate wire 803 to which the input signal A is applied and a gate wire 804 to which the input signal B is applied are formed on the P-type diffusion layer area 801 and the N-type diffusion layer area 802.

More specifically, two P-type MOS transistors formed in the P-type diffusion layer area 801 are connected to each other in parallel with contact holes 805 arranged sandwiching the two gate wires 803 and 804. These contact holes are connected to a metal wiring layer 806 to which supply voltage VCC is applied. At the same time, the two P-type transistors are connected in parallel with contact holes 805 sandwiched between the two gate wires 803 and 804. These contact holes are connected to a metal wiring layer 808 that outputs an output signal OUT.

Two N-type MOS transistors formed in the N-type diffusion layer area 802 in FIG. 8 are connected to each other in series with contact holes 805 arranged to the left of the gate wire 804, and a metal wiring layer 807 to which ground voltage GND is applied. Contact holes 805 arranged to the right of the gate wire 803 are connected with a metal wiring layer 808 to provide an output signal OUT.

The 2-input NAND circuit having the layout pattern shown in FIG. 8 is an example of a design which does not especially consider the area occupied by the transistors and the like.

However, in order to enhance productivity and increase the element packaging density by reducing the size of a semiconductor device, the area occupied by each circuit element and wire must be minimized.

FIG. 9 shows an example of a layout pattern designed from the above viewpoint with respect to the 2-input NAND circuit shown in FIG. 7.

The layout pattern shown in FIG. 9 has a reduced element area as compared with the layout pattern shown in FIG. 8. More specifically, the layout pattern of FIG. 9 uses an arrangement in which the gate wires 903 and 904 of the P-type MOS transistors MP1 and MP2 connected in parallel are bent in the P-type diffusion layer area 901. This reduces the number of contact holes 905, and reduces the size of the P-type diffusion layer area in the lateral direction.

It should be noted that the two gate wires 903 and 904 are connected to a metal wiring layer at a lower left position not shown in the figure via a contact hole. In this example, the position at which the gate wires 903 and 904 are connected to the metal wiring layer is at the lower left of the figure. It will be apparent that the connection may be made at any position depending on the relationship with adjacent elements and wires; for example, positions near the transistor as shown in the figure, away from the same, and the like.

FIG. 10(a) and 10(b) show cross sections of the N-type MOS transistors MN1 and MN2 shown in FIG. 9 obtained by the manufacturing process described with reference to FIGS. 5(a)–5(e). FIG. 10(a) is the cross section along line A—A' of FIG. 9, while FIG. 10(b) is the cross section along line B—B' of FIG. 9. With reference to FIGS. 10(a) and 10(b), parts similar to those previously described in FIG. 5(a)–5(e) are denoted by the same reference numerals.

Referring to FIG. 10(a), if the interval between the adjacent gate wires 903 and 904 is 0.6 $\mu$m and the width of the sidewall 507 is 0.2 $\mu$m, the width of the sidewall opening in the active area between the two gate wires 903 and 904 is 0.2 $\mu$m=0.6 $\mu$m−(2×0.2 $\mu$m). As described above, ion implantation through this 0.2 $\mu$m opening forms the N-type diffusion layer area 508.

Conventionally, in designing the pattern of the semiconductor device composed of transistors having the above-described sidewalls, the minimum interval between the gate wires is limited by the ability to expose and develop the resist into a desired shape by lithography and a manufacturing technology for forming the desired wiring by etching with a patterned resist as a mask.

For example, in lithography technology using a g-line, the minimum gate wiring interval is generally about 0.8 $\mu$m; in lithography technology using an i-line, the minimum gate wiring interval is generally about 0.6 $\mu$m.

The sidewall width is generally about 0.2 $\mu$m. The gate wiring width of 0.6 $\mu$m and the sidewall width of 0.2 $\mu$m in the example of FIGS. 10(a) and 10(b) pose no problem especially.

However, in the development of current semiconductor devices such as semiconductor memory chips, efforts are under way to improve manufacturing techniques for increasing storage capacity while restricting an increase in chip size by reducing the dimensions of the elements constituting the chip and increasing packaging density. As a result, by way of example, the gate wiring interval is made smaller than the conventional 0.6 $\mu$m.

On the other hand, the sidewall width cannot be significantly reduced due to factors other than manufacturing technology, such as assuring the reliability of elements by relaxing the electric field at the gate ends of the drain diffusion layer.

In such a situation, designing a gate wiring interval using a pattern design having the minimum dimensions as limited by the manufacturing technology poses several problems.

The following describes these problems in detail with reference to FIGS. 11 through 13.

For example, a manufacturing process in which the gate wiring interval is 0.4 $\mu$m and the sidewall width is 0.2 $\mu$m, is shown in FIGS. 11(a)–11(c). FIGS. 11(a)–11(c) show the cross section along line A—A' of FIG. 9.

First, as shown in FIGS. 11(a)–11(c), gate wires 903 and 904 are patterned and phosphorous, for example, is implanted to form a shallow $N^+$ diffusion layer area 506 providing the source/drain diffusion layer of an N-type LDD transistor. Then, an insulation film 507 composed of an oxide film having a thickness of 0.2 $\mu$m is grown over the whole surface of the substrate.

The interval between the gate wires 903 and 904 is 0.4 $\mu$m and the thickness of the insulation film 507 providing the sidewall is 0.2 $\mu$m as described above. Therefore, the active area having an interval of 0.4 $\mu$m between the gate wires 903 and 904 is fully covered by the insulation film 507 because the same is grown on the walls of the right and left gate wires to a thickness of 0.2 $\mu$m each (which fills in the area between the adjacent gate wires).

Next, as shown in FIG. 11(b), etch back is performed by anisotropic etching to form the sidewalls, but the active area between the gate wires 903 and 904 remains obstructed by the insulation film.

Then, as shown in FIG. 11(c), arsenic, for example, is ion-implanted to form an $N^+$ diffusion layer area 508 which is a diffusion layer area deeper than an $N^-$ diffusion layer area 506 providing the source/drain diffusion layer of the N-type LDD transistor. Since the active area between the gate wires 903 and 904 is covered and blocked by the insulation film 507, arsenic cannot be implanted into the active area. This results in a diffusion area in this portion composed of only the shallow $N^-$ diffusion layer area 506.

The following describes the above-manufacturing process with reference to FIGS. 12(a) and 12(b) showing the cross section along the line B—B' of FIG. 9.

First, as shown in FIG. 12(a), the gate wires 903 and 904 are patterned and then the insulation film 507 composed of the oxide film having a thickness of up to 0.2 $\mu$m is grown over the whole surface of the substrate.

In this case, too, the portion between the two gate wires 903 and 904 is fully covered and blocked by the insulation film 507.

Next, as shown in FIG. 12(b), etch back is performed by anisotropic etching to form the sidewalls, but the portion between the gate wires 903 and 904 remains obstructed by the insulation film 507.

In the examples described with reference to FIGS. 11 and 12, the two gate wires 903 and 904 formed on the field insulation film 502 which function as signal wires do not especially pose any problem.

However, as shown in FIGS. 11(a)–11(c), in the area functioning as a transistor, the active area between the gate wires 903 and 904 is constituted by the N⁻ diffusion layer area 506. This makes the diffusion layer resistance very high, thereby lowering the transistor performance.

The following describes the above-mentioned manufacturing process along line C—C' of FIG. 9 with reference to FIG. 13.

FIG. 13 shows the cross section of the P-type MOS transistors MP1 and MP2 shown in FIG. 9 along the line C—C'. If the gate wiring interval is 0.4 μm and the sidewall width is 0.2 μm, then, in the sidewall transistor shown in FIGS. 6(a)–6(e), for example, the active area between the gate wires 903 and 904 is covered and blocked by the insulation film 607, so that the active area is not implanted. This poses a fatal problem in that a diffusion layer is not formed and a high performance transistor is not obtained.

These problems are solved in a semiconductor device proposed by Japanese Unexamined Patent Publication No. 5-343419 (hereinafter referred to as reference example) by way of example.

The above-described reference example proposes to lower the diffusion layer resistance in the source diffusion layer between the gate wires. After the sidewall is formed by a conventional manufacturing process and before ion-implanting, the portion between the gate wires is exposed through a resist mask. The sidewall is further etched back using the resist as a mask to reduce the thickness of the sidewalls arranged between the gate wires, and to thereby enlarge the opening of the active area.

As shown in the reference example, adding the etch back process for partially etching back the sidewall can enlarge the opening of the active area between the gate wires. However, the technique proposed in the reference example is applicable only to the source/diffusion layer between the gate wires from the viewpoint of reliability, and not to a drain diffusion layer to which a voltage is applied.

The technique described in the reference example also poses a problem in that the PR number (number of lithographic steps) is increased by partial etch back of the sidewall.

SUMMARY OF THE INVENTION

It is therefore an object of the present invention to provide a semiconductor device having a plurality of MOS transistors and adjacent gate wires having a sidewall arranged on the walls of said gate wires, which circumvents the problem that occurs when the area between the adjacent gate wires is covered by the sidewalls to thereby block ion implantation in the active area and, at the same time, which device achieves a high packaging density.

Another object of the present invention is to provide a method of manufacturing the above-described semiconductor device and, more particularly, a method of designing layout patterns for use in manufacturing the semiconductor device.

The present invention solves the above problems of the prior art by providing a semiconductor device comprising a substrate having thereon an active area including a plurality of MOS transistors, an inactive area, and adjacent gate wires having walls and a sidewall on the walls of said gate wires, said adjacent gate wires being arranged on said active area and on said inactive area, wherein a first interval between said adjacent gate wires on an active area is greater than a second interval between said adjacent gate wires on an inactive area.

In another aspect thereof, the present invention provides a semiconductor device, wherein the first interval is greater than twice the width of said sidewall.

According to yet another aspect, the present invention provides a semiconductor device, wherein the MOS transistor is selected from the group consisting of an LDD transistor, a DDD transistor and a sidewall transistor.

Thus, the gate wiring interval in a portion of the device in which a transistor is formed is not determined by the minimum interval that can be achieved by gate wiring patterning technology, but is set to an interval that is at least more than twice the width of the sidewall. The present invention circumvents the problem that occurs when the active area between the adjacent gate wires is covered by the sidewalls to thereby block ion implantation. At the same time, the novel constitution of the invention enhances the wiring density in the gate wiring portion by applying the minimum interval that can be achieved by patterning technology to the interval between gate wires that are used as signal wires arranged on inactive areas of the device.

DETAILED DESCRIPTION OF THE INVENTION

Figure 7:
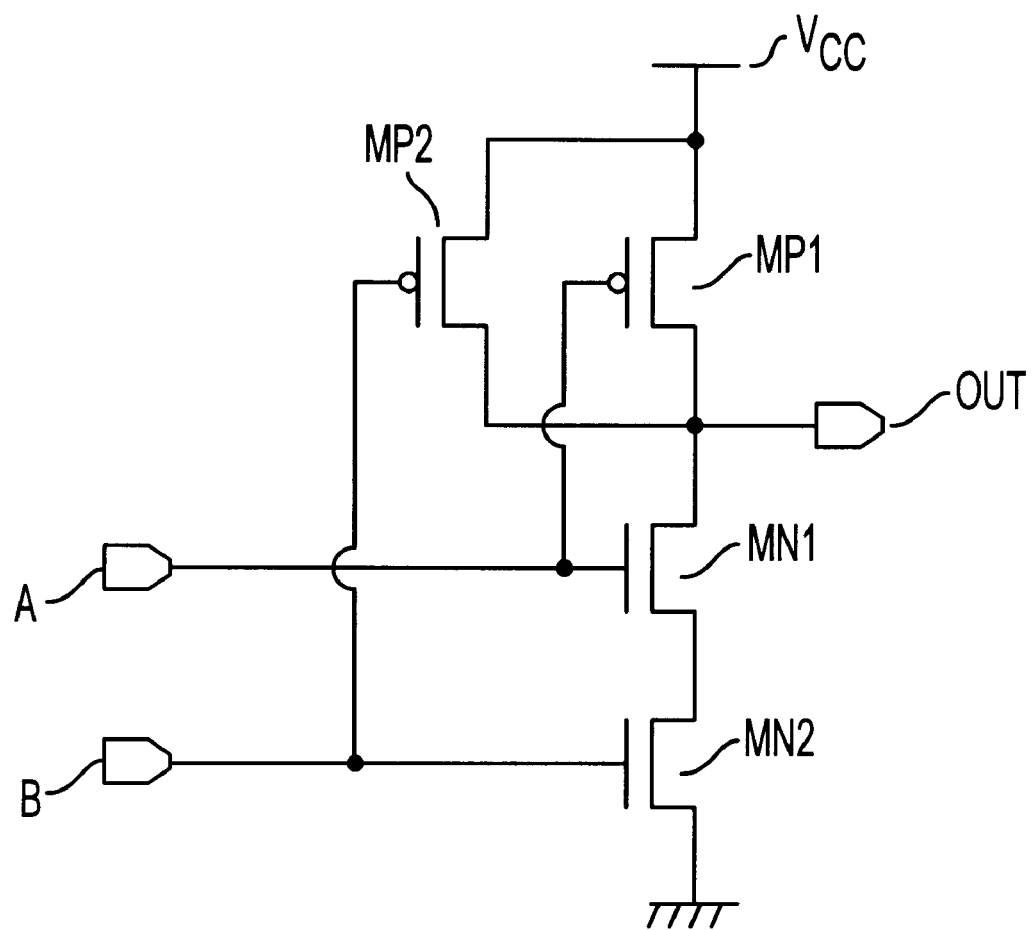
FIG. 7 is a circuit diagram illustrating a 2-input NAND circuit.
Figure 8:
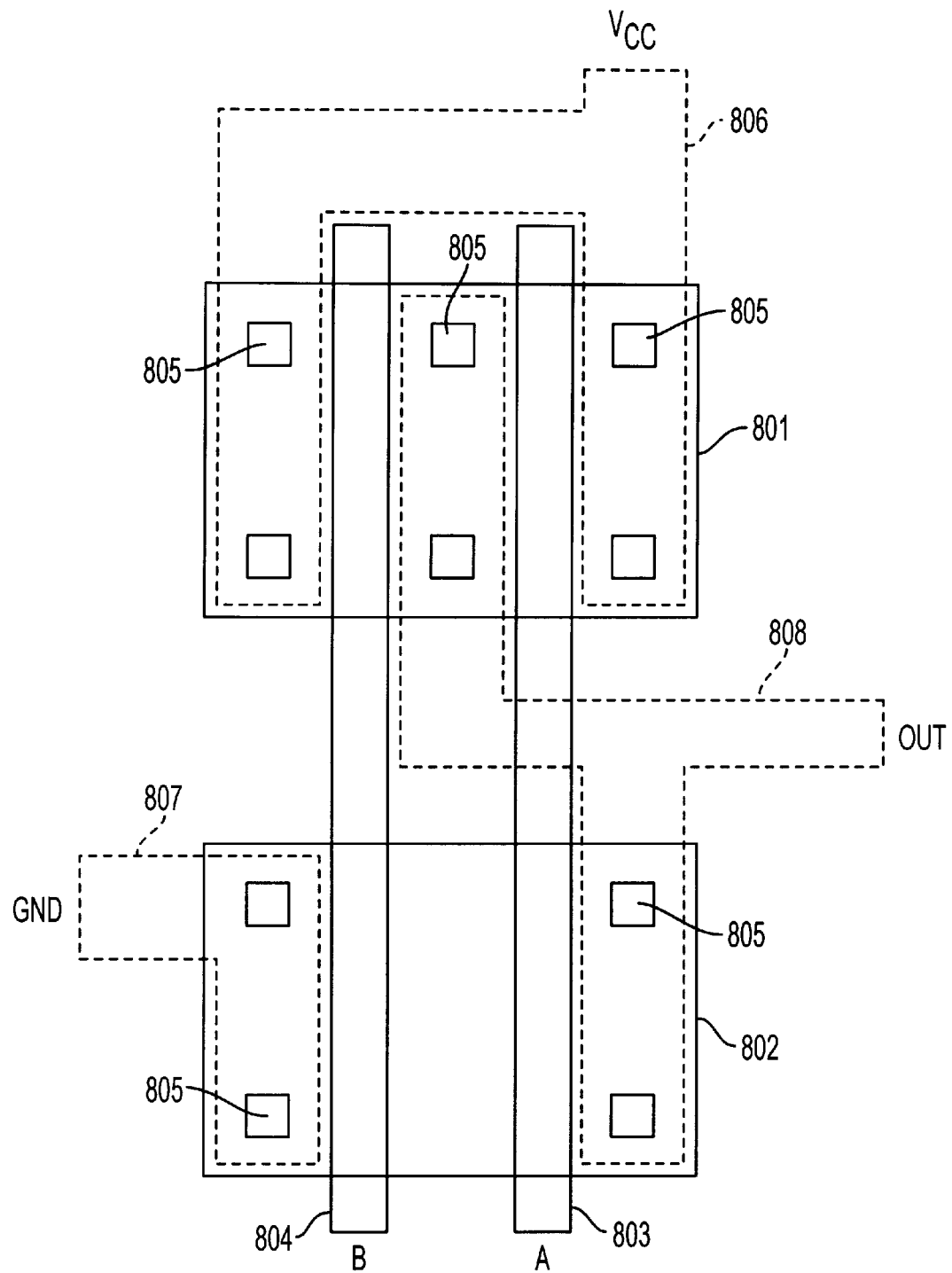
FIG. 8 is a top view illustrating an example of the layout pattern of a conventional 2-input NAND circuit.
Figure 9:
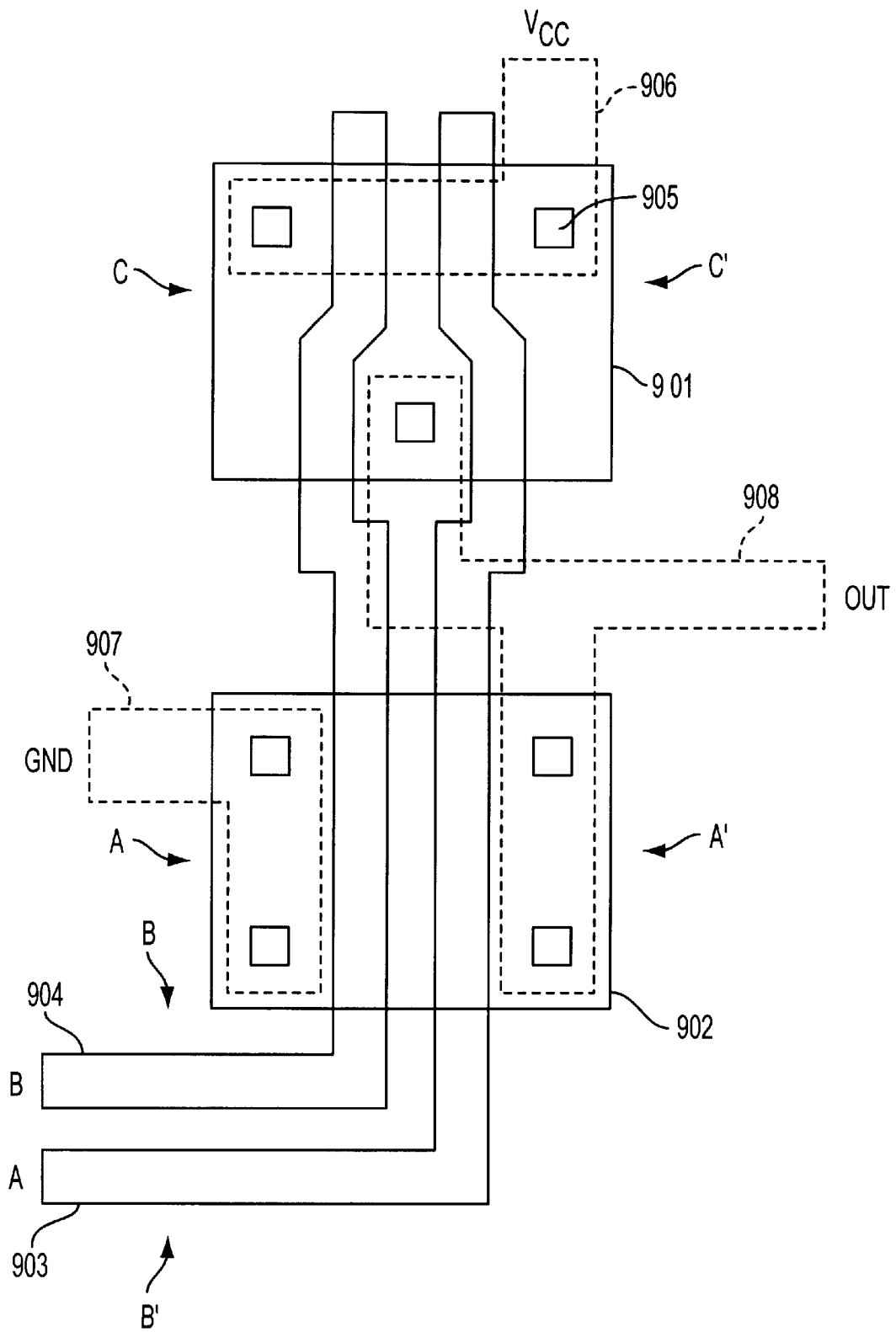
FIG. 9 is a top view illustrating another example of the layout pattern of a conventional 2-input NAND circuit.
Figure 10A:
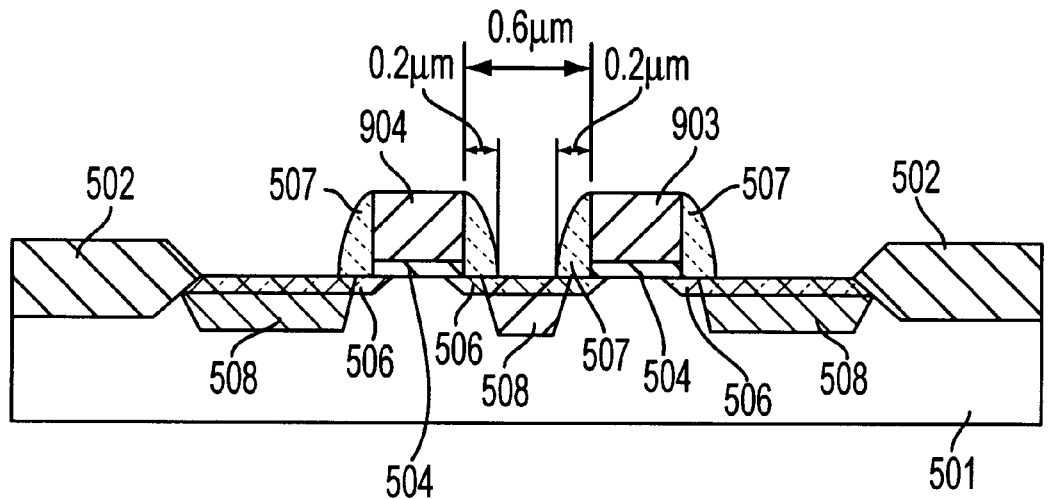
FIG. 10(a) is a cross section along line A—A' of FIG. 9
Figure 10B:
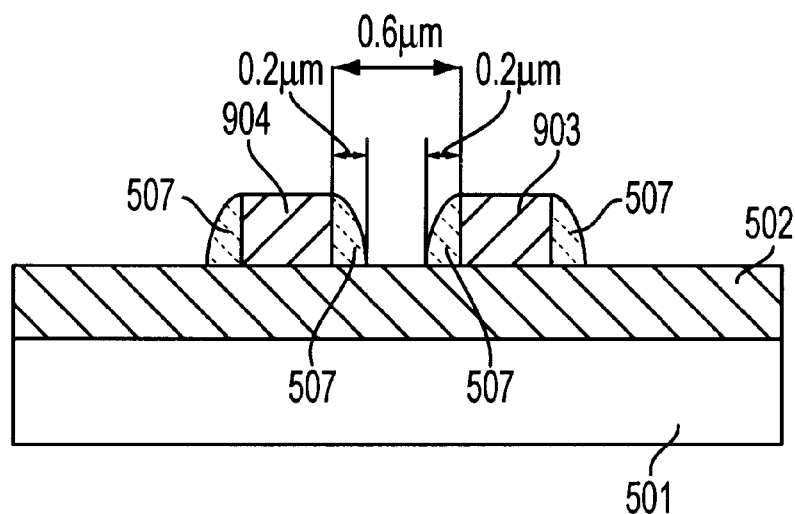
FIG. 10(b) is a cross section along line B—B' of FIG. 9.
Figure 11A:
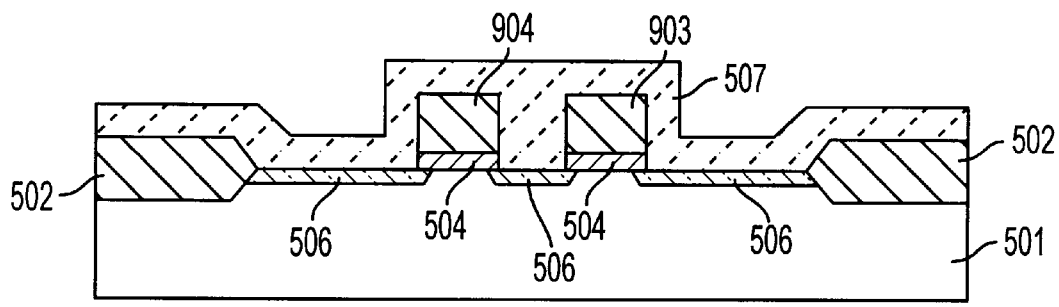
FIGS. 11(a)–11(c) show the manufacturing process for the cross section along line A—A' of FIG. 9 having a reduced gate wiring interval.
Figure 11B:
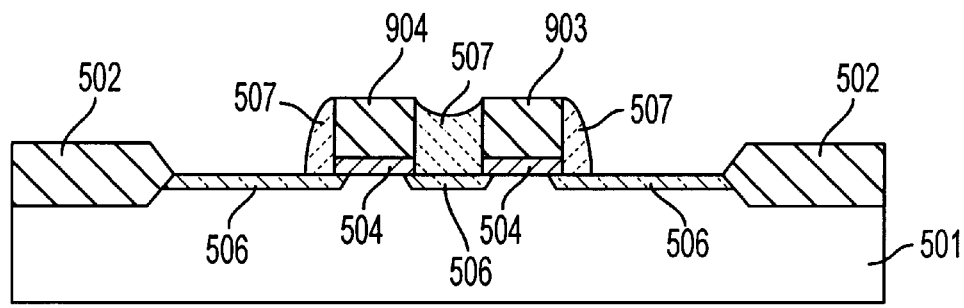
Figure 11C:
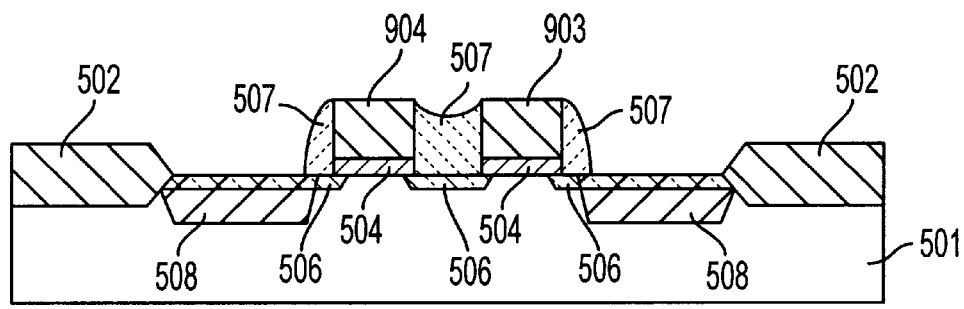
Figure 12A:
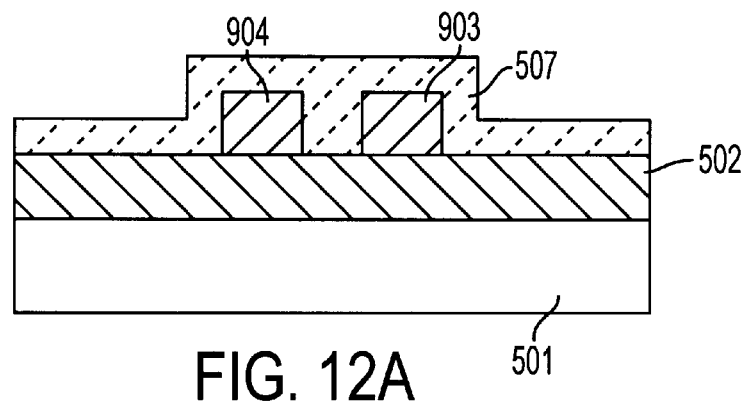
FIGS. 12(a) and 12(b) show the manufacturing process for the cross section along line B—B' of FIG. 9 having a reduced gate wiring interval.
Figure 12B:
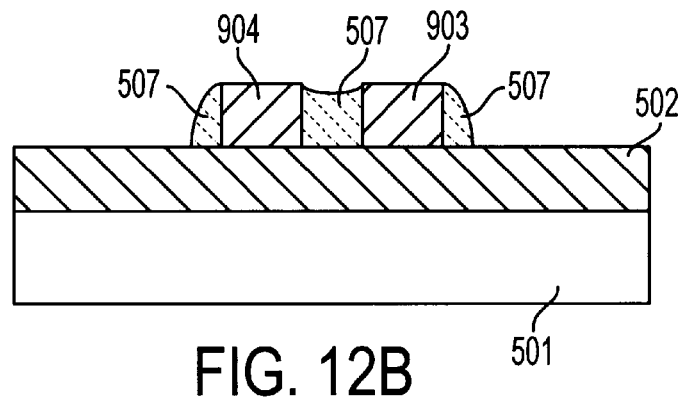
Figure 13:
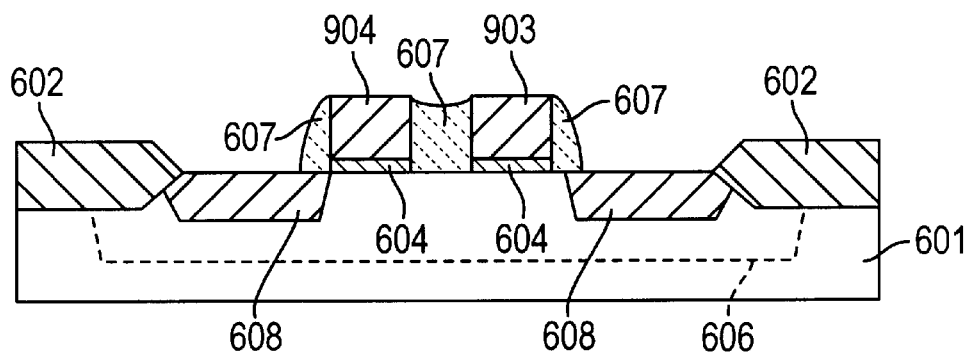
FIG. 13 shows a cross section along line C—C' of FIG. 9 having a reduced gate wiring interval.

This invention is described in further detail using the 2-input NAND circuit shown in FIG. 7 by way of example with reference to FIGS. 1 through 4.

Figure 1:
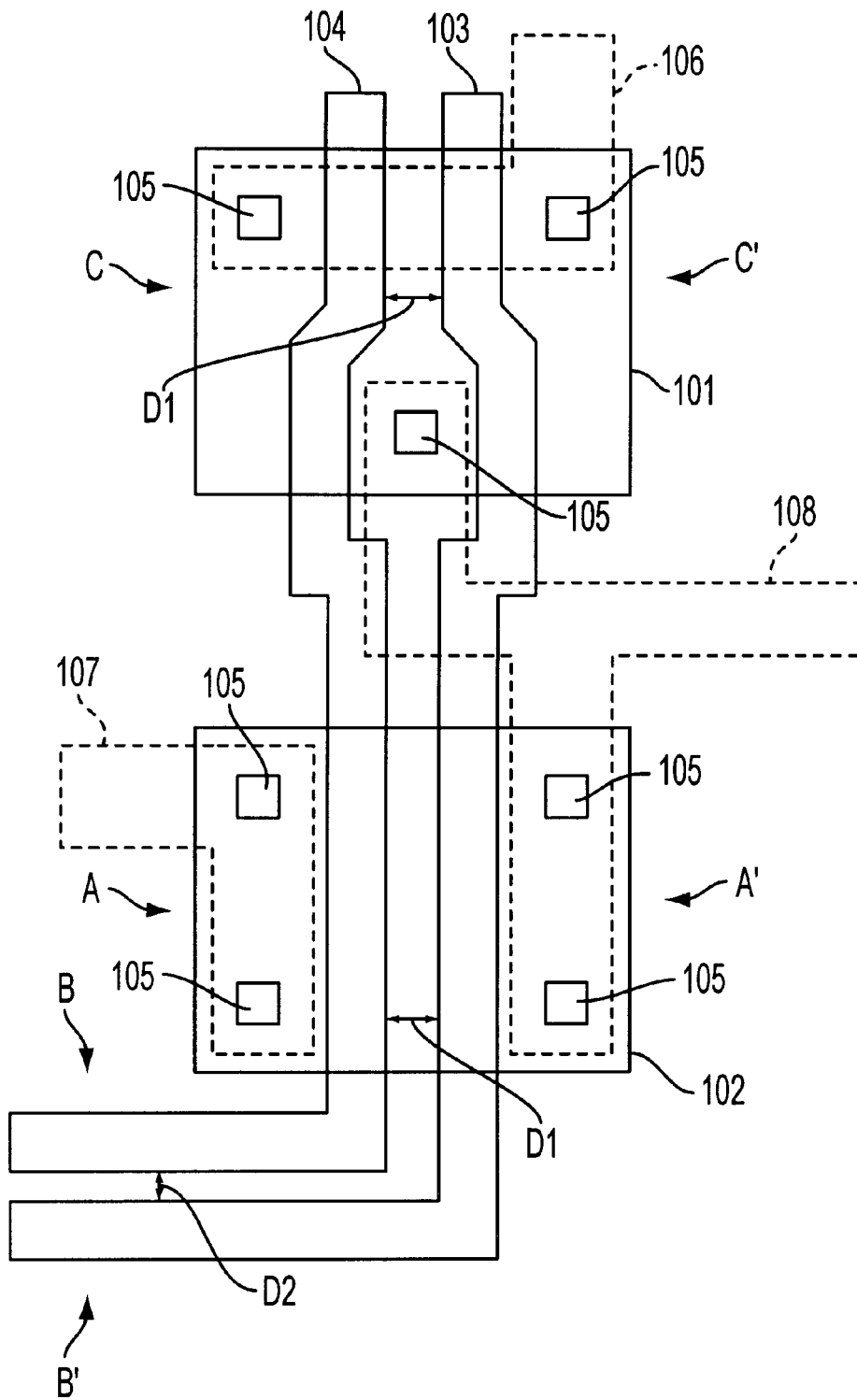
FIG. 1 is a top view illustrating a layout pattern of a preferred embodiment of the present invention.

FIG. 1 shows a top view of a mask pattern of a preferred embodiment of the present invention.

The 2-input NAND circuit practiced as a preferred embodiment of the present invention has a P-type diffusion layer 101 and an N-type diffusion layer 102. A gate wire 103 to which an input signal A is applied and a gate wire 104 to which an input signal B is applied are formed on the P-type diffusion layer 101 and the N-type diffusion layer 102. Especially, on the P-type diffusion layer 101, the gate wires 103 and 104 are bent.

More specifically, in the narrow portion between the two gate wires 103 and 104, the two P-type transistors formed in the P-type diffusion layer 101 are connected in parallel, at contacts 105 formed in an area sandwiching both the gate wires 103 and 104, to a metal wiring layer 106 supplied with a power supply voltage VCC. In the wide portion between the two gate wires 103 and 104, the two P-type transistors are connected in parallel, at a contact 105 formed in an area sandwiched between the two gate wires 103 and 104, to a metal wiring layer 108 for outputting an output signal OUT.

The two N-type MOS transistors formed in the N-type diffusion layer 102 are connected in series, at contacts 105 formed to the left of the gate wire 104 in FIG. 1, to a metal wiring layer 107 supplied with a ground voltage GND, and at contacts 105 formed to the right of the gate wire 103, to the metal wiring layer 108 for providing the output signal OUT.

The two gate wires 103 and 104 are connected to a metal wiring layer via a contact (not shown) in the lower left portion of the figure. In this example, the position at which the gate wires 103 and 104 are connected to the metal wiring layer is in the lower left of the figure. This position may be near or far away from the transistors depending on the relationship with adjacent elements and wires.

In the present embodiment, a first minimum interval D1 providing a gate wiring minimum interval in the portion functioning as a gate electrode of the P-type MOS transistor and the N-type MOS transistor and a second minimum interval D2 providing a gate wiring minimum interval in the portion functioning as a signal wire extended in the lower left direction of FIG. 1 are determined as follows from the graph of FIG. 2. The first and second minimum intervals D1 and D2 are shown in FIG. 1.

Figure 2:
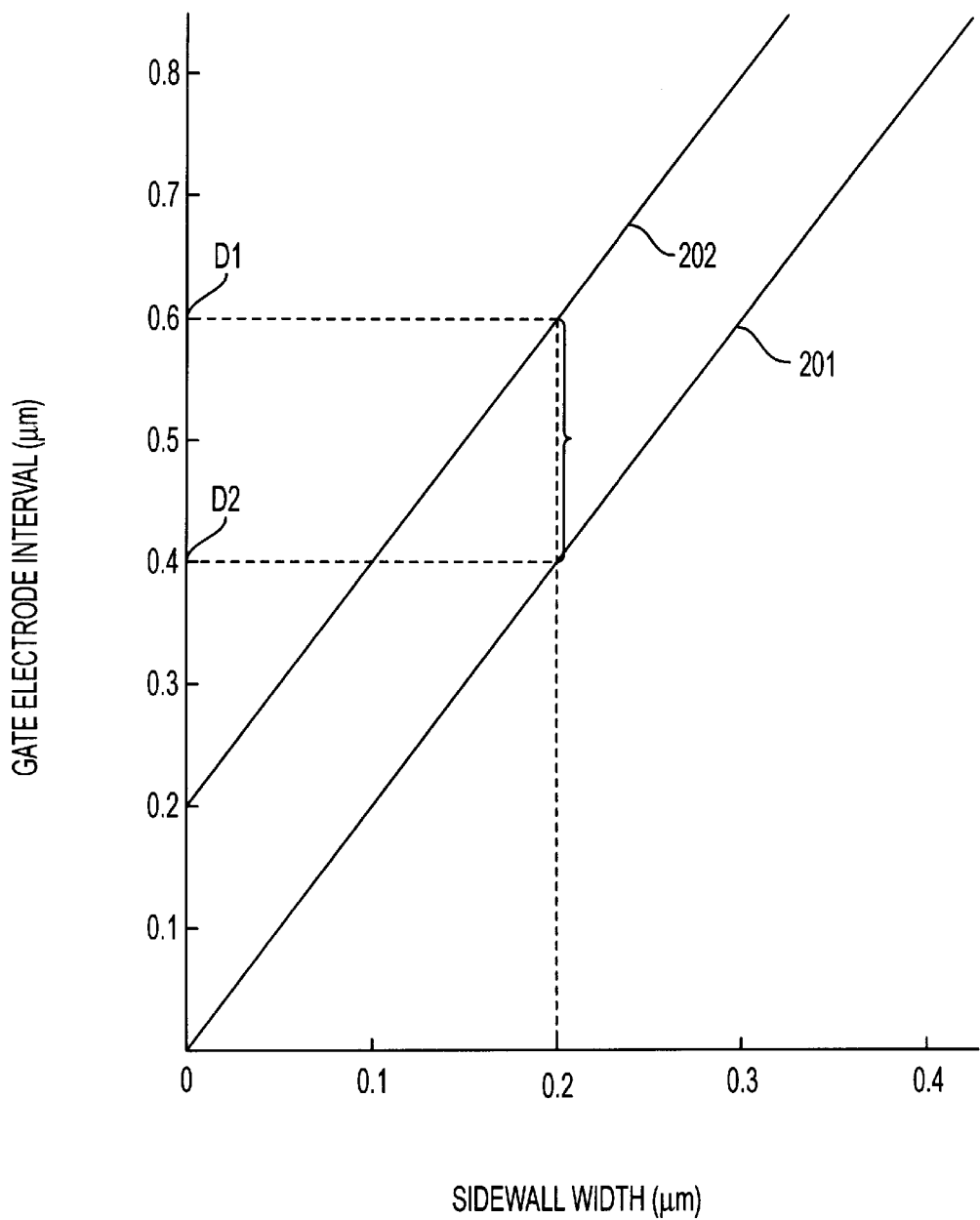
FIG. 2 is a graph for use in determining the first and second minimum intervals in the embodiment of the present invention.

In the graph of FIG. 2, the horizontal axis represents the sidewall width, while the vertical axis represents the gate wiring interval. The solid line 201 is determined by (gate wiring interval)=2×(sidewall width) and the solid line 202 is determined by (gate wiring interval)=2×(sidewall width)+(opening between gate wires). In the present embodiment, the solid line 202 is drawn with an opening of 0.2 μm between the gate wires. Based on the solid line 202, the gate wiring minimum interval is determined.

In the graph shown in FIG. 2, if the sidewall width is 0.2 μm and the gate wiring interval that can be patterned based on gate wire patterning technology is 0.4 μm, the second minimum interval D2 is selected to be 0.4 μm from the solid line 201, which is the gate wiring interval that can be patterned based on gate wire patterning technology.

On the other hand, if the first minimum interval D1 in the portion functioning as a transistor gate electrode is set to be 0.4 μm which is the same as the second minimum interval D2, then the sidewalls fill in the portion between the gate wires, thereby presenting the above-described problem with respect to blocking ion implantation in the active area.

Therefore, in the present invention, a necessary width for the opening is determined beforehand, and the gate wiring interval in the portion functioning as the gate electrode is determined from the graph of FIG. 2 by considering the opening width. In the present embodiment, the opening width is 0.2 μm, so that the first minimum interval D1 can be obtained from the intersection between the perpendicular line running from the sidewall width of 0.2 μm on the horizontal axis and the solid line 202, such that D1 is selected to be 0.6 μm.

Figure 3A:
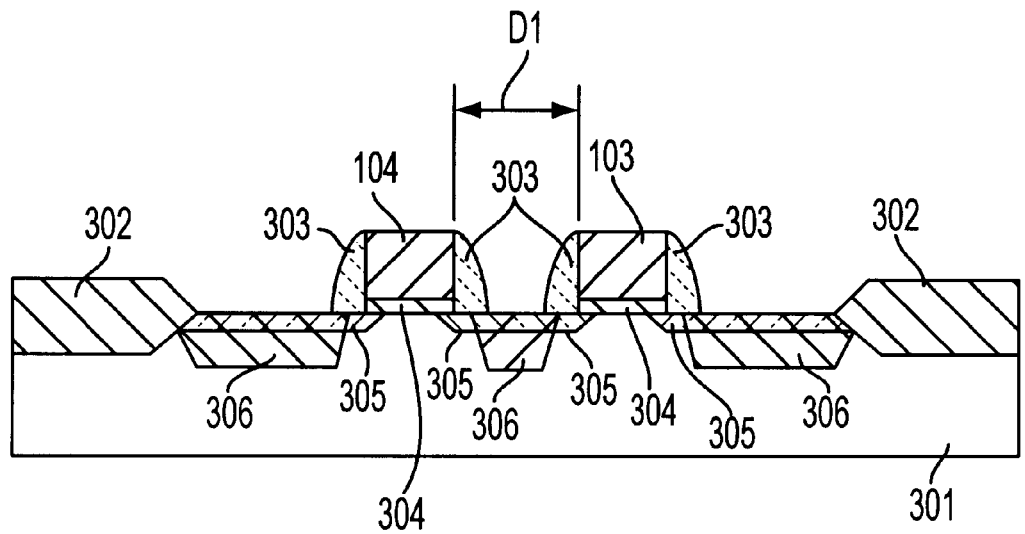
FIG. 3(a) is a cross section along line A—A' of FIG. 1
Figure 3B:
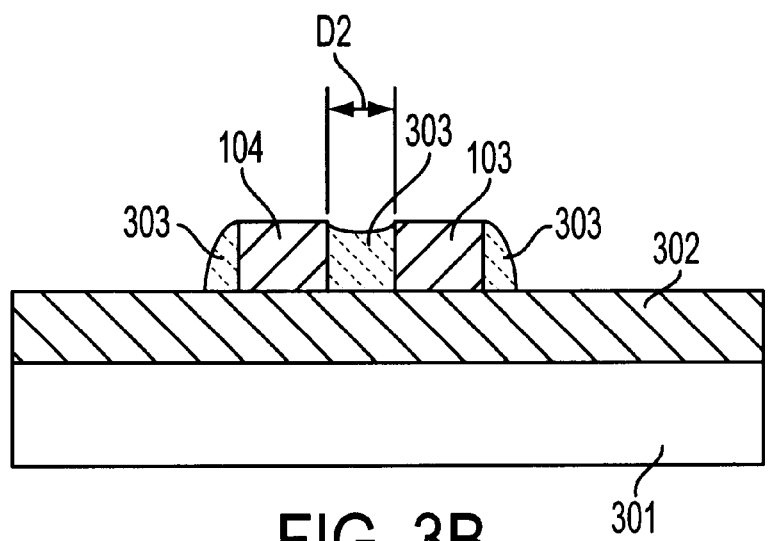
FIG. 3(b) is a cross section along line B—B' of FIG. 1.

The 2-input NAND circuit designed by the layout pattern having first and second minimum intervals D1 and D2 is thus determined and formed by the manufacturing process shown in FIGS. 5(a)–5(e) to provide the structures shown in FIGS. 3(a) and 3(b). FIG. 3(a) shows a cross section along line A—A' of FIG. 1 and FIG. 3(b) shows a cross section along line B—B' of FIG. 1.

In the cross section along line A—A' of FIG. 1, the two gate wires 103 and 104 are arranged on the gate insulation film 304 on the P-type semiconductor substrate 301 with the first minimum interval D1 as shown in FIG. 3(a).

Because the first minimum interval D1 has a value greater by 0.2 μm than twice the thickness of the sidewall 303, the sidewall opening of the active area between the two gate wires 103 and 104 can be at least 0.2 μm. Therefore, not only the shallow N⁻ diffusion layer area 305 resulting from the ion-implantation before sidewall formation, but also the deep N⁺ diffusion layer area 306 resulting from ion-implantation after sidewall formation is surely formed.

On the other hand, in the cross section along line B—B' of FIG. 1, the two gate wires 103 and 104 are arranged on the field insulation film 302 with the second minimum interval D2 as shown in FIG. 3(b).

The gate wires 103 and 104 in the portion functioning as signal wires are arranged with the second minimum interval as the gate wire minimum interval 0.4 μm that can be patterned and determined by gate wire patterning technology.

Since the sidewall width is 0.2 μm, the portion between the two gate wires 103 and 104 functioning as the signal lines is filled in by the side walls 303.

However, the portion between the gate wires 103 and 104 where the gate wires function as signal lines is an inactive area which does not require ion implantation. Thus, covering and blocking the inactive area with the sidewalls 303 does not pose any problem. On the contrary, this structure reduces the size of the wiring area by shortening the wiring interval and consequently increasing the wiring density, which results in a reduced element size as a whole.

Figure 4:
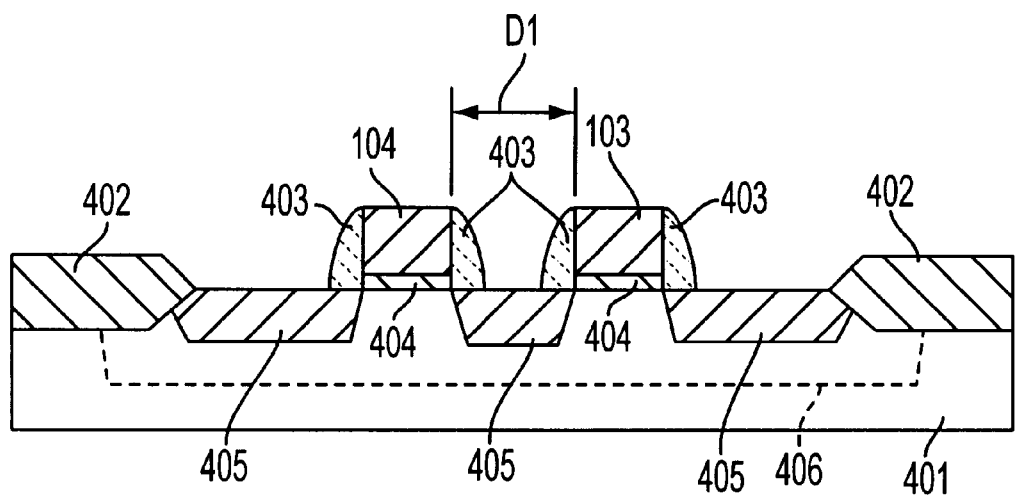
FIG. 4 is a cross section along line C—C' of FIG. 1.
Figure 5A:
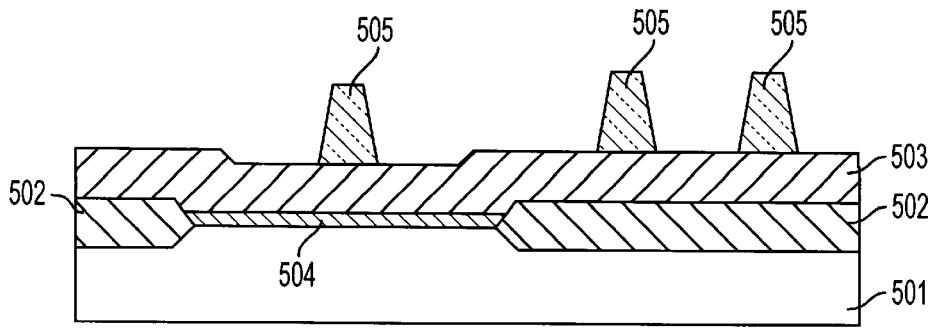
FIGS. 5(a)–(e) are cross sections illustrating the manufacturing process for a conventional N-type LDD transistor.
Figure 5B:
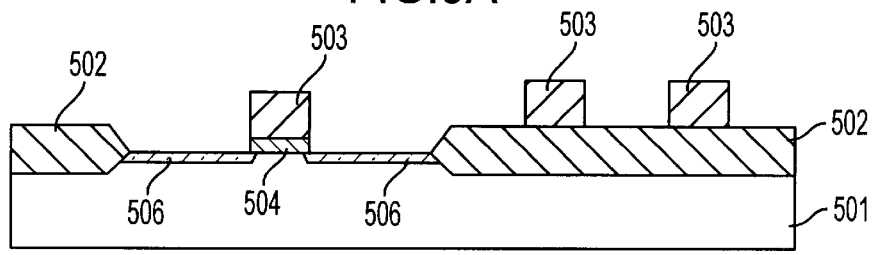
Figure 5C:
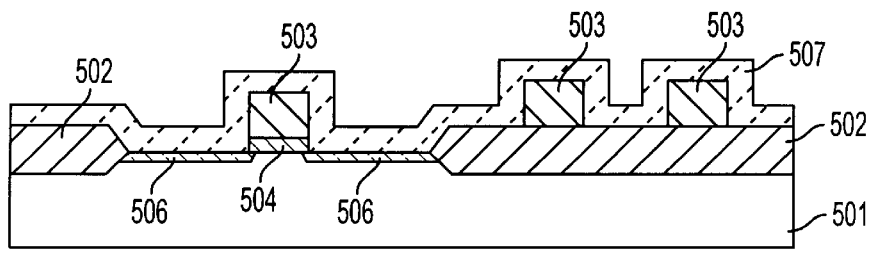
Figure 5D:
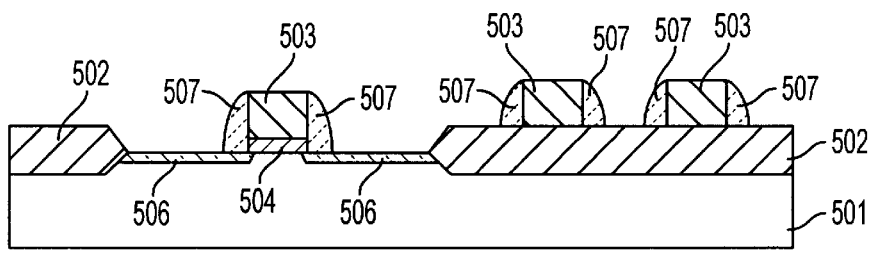
Figure 5E:
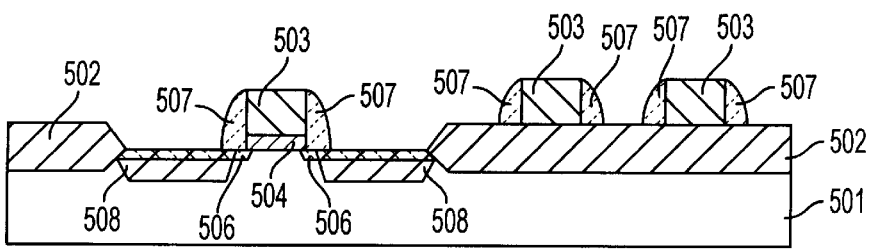
Figure 6A:
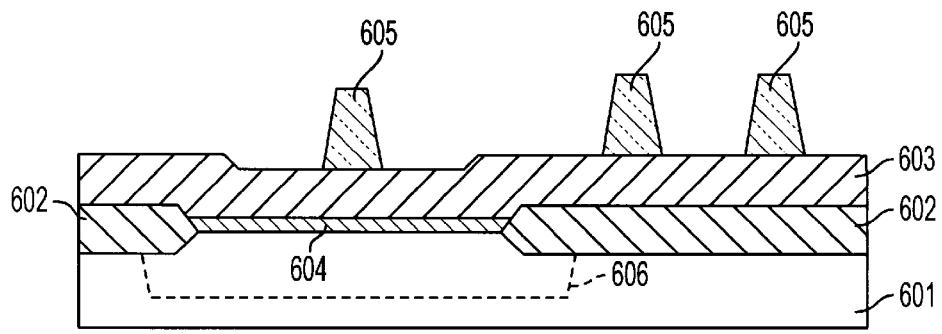
FIGS. 6(a)–6(e) are cross sections illustrating the manufacturing process for a conventional P-type sidewall transistor.
Figure 6B:
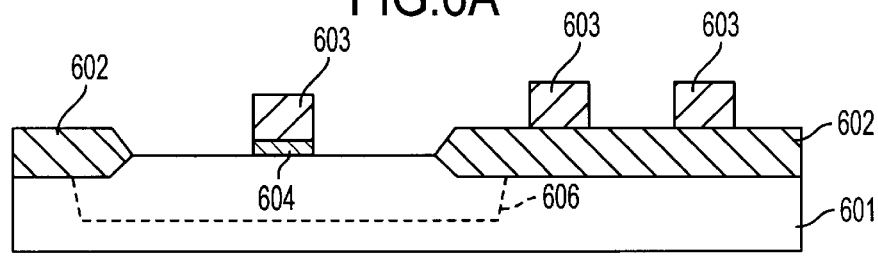
Figure 6C:
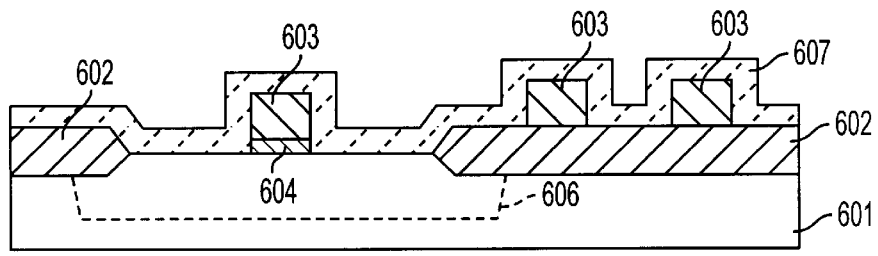
Figure 6D:
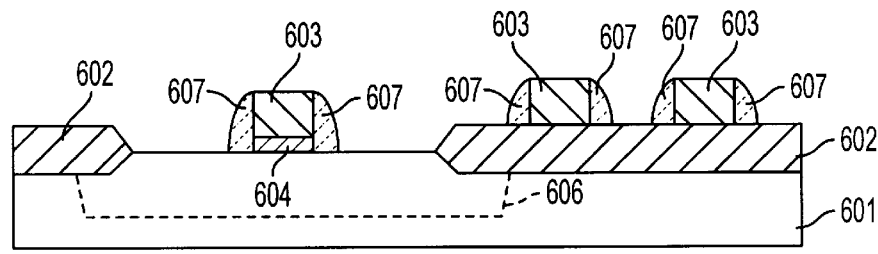
Figure 6E:
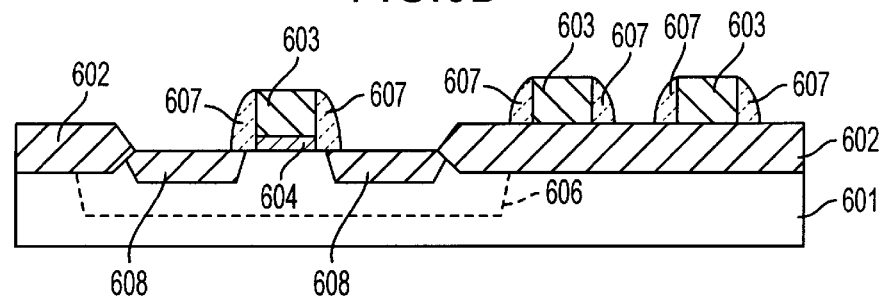

FIG. 4 shows a cross section of the P-type sidewall transistor along line C—C' of FIG. 1 designed by the same technique as shown in FIG. 3(a).

The transistor of FIG. 4 is manufactured by the manufacturing process shown in FIGS. 6(a)–6(e), in which reference numerals 401 through 406 indicate a P-type semiconductor substrate, a field insulation film, a sidewall, a gate insulation film, a P-type diffusion layer area, and an N-type well area, respectively.

In this example, too, the two gate wires 103 and 104 of the portion functioning as a transistor gate electrode are designed such that the first minimum interval is greater by 0.2 μm than twice the thickness of the sidewall 403. Therefore, the sidewall opening of the active area between the two gate wires 103 and 104 is at least 0.2 μm, so that the P-type diffusion layer 405 resulting from ion implantation after sidewall formation is surely formed.

In pattern design, a CAD tool is generally used to verify that a mask pattern prepared to make the semiconductor device satisfies the dimensional requirements. If the portion of the gate wires that functions as a transistor electrode and the portion that functions as a signal line have the same minimum interval as in a conventional device, the interval is checked without distinguishing between the gate wires in the active and inactive areas.

However, in the present invention, unlike conventional technologies, the portion functioning as the transistor gate electrode and the portion functioning as the signal line have a different interval between the gate wires.

Thus, if the minimum interval between the gate wires in the portion functioning as the transistor gate electrode is different from the portion functioning as the signal line, the portion functioning as the transistor gate electrode may be extracted by performing an AND operation between the diffusion layer pattern and the gate wiring pattern, and the portion functioning as the signal line may be extracted by subtracting the diffusion layer pattern from the gate wiring pattern.

Consequently, separately checking the intervals of the extracted patterns enables such verification.

As described above and according to the present invention, the problem where the active area between adjacently arranged gate wires is covered by the sidewalls to block ion implantation can be circumvented without increasing the PR number. Also, at the same time, the overall size of the semiconductor device can be reduced and the wiring density can be increased by applying a realizable minimum interval to those portions, which function as signal wires arranged on inactive areas.

It should further be apparent to those skilled in the art that various changes in form and detail of the invention as shown and described above may be made. It is intended that such changes be included within the spirit and scope of the claims appended hereto.

What is claimed is:

1. A semiconductor device comprising a substrate having thereon an active area including a plurality of MOS transistors, an inactive area, and adjacent gate wires having walls, and sidewall insulating films formed on the walls of said gate wires, said adjacent gate wires being arranged on said active area and on said inactive area,
   wherein a first minimum interval between said adjacent gate wires on an active area is greater than a second minimum interval between said adjacent gate wires on an inactive area.

2. The semiconductor device as claimed in claim 1, wherein said first interval is greater than twice the width of said sidewall.

3. The semiconductor device as claimed in claim 1, wherein said MOS transistor is selected from the group consisting of an LDD transistor, a DDD transistor and a sidewall transistor.

4. The semiconductor device as claimed in claim 1, wherein said active area comprises at least one of a source and drain region of said MOS transistors formed by introducing an impurity in an interval between said adjacent gate wires.

5. The semiconductor device as claimed in claim 1, wherein said sidewall comprises silicon oxide and said gate wires comprise polysilicon.

6. The semiconductor device as claimed in claim 1, wherein said inactive area comprises a field insulation area of said substrate.

7. The semiconductor device as claimed in claim 1, wherein the interval between said adjacent gate wires on an inactive area is blocked by said sidewalls and the interval between the same adjacent gate wires on an active area is not blocked by said sidewalls.

8. The semiconductor device as claimed in claim 7, wherein the opening between adjacent sidewalls of said adjacent gate wires on an active area is at least 0.2 µm.

9. The semiconductor device as claimed in claim 1, wherein the interval between said adjacent gate wires on an active area is a minimum interval needed to provide an opening between the gate wires that is not blocked by said sidewalls.

10. A semiconductor device comprising a semiconductor substrate having thereon a first active area including first and second transistors of a first conductivity type, a second active area including first and second transistors of a second conductivity type, an inactive area defining said first and second active areas, adjacent first and second gate wires arranged on said active and inactive areas having walls, and sidewall insulating films on the walls of said gate wires, said first gate wire connecting a gate of said first transistor of a first conductivity type and said first transistor of a second conductivity type, and said second gate wire connecting a gate of said second transistor of a first conductivity type and said second transistor of a second conductivity type,
   wherein said active areas comprise at least one of a source and drain region of said transistors of a first and second conductivity type formed by introducing an impurity in an interval on an active area between said adjacent gate wires on an active area, and said interval on an active area is greater than a second interval between said adjacent gate wires on an inactive area.

11. The semiconductor device as claimed in claim 10, wherein said substrate is a P-type substrate, said first active area comprises an N-type well, said transistors of a first conductivity type are P-type transistors formed in the N-type well, and said transistors of a second conductivity type are N-type transistors.

12. The semiconductor device as claimed in claim 10, wherein said transistors of a first conductivity type are P-type transistors that are connected in parallel and said transistors of a second conductivity type are N-type transistors that are connected in series to provide a 2-input NAND circuit.

13. The semiconductor device as claimed in claim 12, wherein said first N-type transistor has a drain region in common with the source region of said second N-type transistor, one of said gate wires is a first input and the other of said gate wires is a second input of said 2-input NAND circuit, the source regions of said P-type transistors are connected to a power supply voltage, the drain region of said second N-type transistor is connected to ground, and said P-type transistors have a common drain region connected to the source region of said first N-type transistor to provide an output of the 2-input NAND circuit.

14. The semiconductor device as claimed in claim 13, wherein the common drain region of said P-type transistors is formed by introducing an impurity in a first interval between said adjacent gate wires on said first active area, the common drain region of said first N-type transistor and source region of said second N-type transistor is formed by introducing an impurity in a third interval between said adjacent gate wires on said second active area, and said first and third intervals are each greater than the second interval between said adjacent gate wires on an inactive area.

15. The semiconductor device as claimed in claim 10, wherein said interval on an active area is greater than twice the width of said sidewall insulating films.

16. The semiconductor device as claimed in claim 10, wherein said inactive area comprises a field insulation area of said substrate.

17. The semiconductor device as claimed in claim 1, wherein the interval between said adjacent gate wires on an inactive area is blocked by said sidewall insulating films and the interval between the same adjacent gate wires on an active area is not blocked by said sidewall insulating films.

18. The semiconductor device as claimed in claim 1, wherein the interval between said adjacent gate wires on an active area is a minimum interval needed to provide an opening between the gate wires that is not blocked by said sidewall insulating films.

19. A semiconductor device comprising:

a semiconductor substrate having a first active region of a first conductivity type and a second active region of a second conductivity type different from said first conductivity type;

a field insulating film formed on said semiconductor substrate defining said first and second active regions;

first, second and third diffusion areas of said second conductivity type formed in said first active region;

fourth, fifth and sixth diffusion areas of said first conductivity type formed in said second active region;

a first wire formed on said field insulating film and on said first and second active regions, said first wire being located between said first and second diffusion areas and between said fourth and fifth diffusion areas; and a second wire formed on said field insulating film and on said first and second active regions, said second wire being located between said first and third diffusion areas and between said fifth and sixth diffusion areas, said first and second wires having a first interval defined between said first and second wires on said second active region, said first and second wires having a second interval defined between said first and second wires on said field insulating film, and said first interval is greater than said second interval.

20. The semiconductor device as claimed in claim 19, wherein said first and second wires have a third interval defined between said first and second wires on said first active region, said third interval being greater than said second interval.

21. The semiconductor device as claimed in claim 20, wherein said first interval has substantially the same value as said third interval.

22. The semiconductor device as claimed in claim 19, wherein said first diffusion area is electrically connected to said fourth diffusion area.

23. The semiconductor device as claimed in claim 20, wherein said second and third diffusion areas are electrically connected to a first power voltage and said sixth diffusion area is electrically connected to a second power voltage.

24. A semiconductor device comprising:

first and second transistors each having a source-drain path, the source-drain paths of said first and second transistors being connected in series between a power voltage line and a circuit node;

a field insulating film selectively formed in a semiconductor substrate to define a part of said semiconductor substrate as an active region;

first, second and third diffusion areas selectively formed in said active region, said first diffusion area serving as one of source and drain regions of said first transistor and being connected to said power voltage line, said second diffusion area serving as one of source and drain regions of said second transistor and being connected to said circuit node, and said third region serving in common as the others of the source and drain regions of said first and second transistors;

a first gate wiring formed on said first gate insulating film covering a part of said active region between said first and third diffusion areas and being elongated over said field insulating film;

a second gate wiring formed on said second gate insulating film covering another part of said active region between said second and third diffusion areas and being elongated over said field insulating film; and said first and second gate wirings forming a first interval therebetween above said active region and second interval therebetween above said field insulating film, said first interval being greater than said second interval.

25. The semiconductor device as claimed in claim 24, wherein said third diffusion area is brought into a floating state when both of said first and second transistors are turned off.

26. The semiconductor device as claimed in claim 24, further comprising a first sidewall insulating film formed on a sidewall of said first gate wiring and a second sidewall insulating film formed on a sidewall of said second gate wiring, said first and second sidewall insulating films being in contact with each other on said field insulating film whereas they are separate from each other at said active region.

* * * * *